(12) United States Patent
Murakami et al.

(10) Patent No.: US 6,481,100 B2
(45) Date of Patent: Nov. 19, 2002

(54) WIRING BOARD MANUFACTURE METHOD, WIRING BOARD, AND ELECTRICAL CONNECTION BOX

(75) Inventors: Masakazu Murakami, Suzuka (JP); Mitsuo Tanaka, Suzuka (JP); Tatsuo Satori, Suzuka (JP)

(73) Assignee: The Furukawa Electric Co., Ltd. (JP)

( * ) Notice: Subject to any disclaimer, the term of this patent is extended or adjusted under 35 U.S.C. 154(b) by 139 days.

(21) Appl. No.: 09/771,401

(22) Filed: Jan. 26, 2001

(65) Prior Publication Data

US 2001/0010121 A1 Aug. 2, 2001

(30) Foreign Application Priority Data

Jan. 27, 2000 (JP) ........................................ 2000-018658
Nov. 30, 2000 (JP) ........................................ 2000-365334

(51) Int. Cl.⁷ .......................... H01K 3/10; H01R 43/033

(52) U.S. Cl. ............................ 29/850; 29/825; 29/33 F

(58) Field of Search ................................ 439/404, 405, 439/709, 949; 29/825, 846, 850, 33 F

(56) References Cited

U.S. PATENT DOCUMENTS 4,518,216 A * 5/1985 Brandeau .................. 339/97 P

FOREIGN PATENT DOCUMENTS

| JP | 11-165544 | 6/1999 |
| JP | 2001-057724 | 2/2001 |

* cited by examiner

Primary Examiner—Edward K. Look
Assistant Examiner—Kimya N. McCoy
(74) Attorney, Agent, or Firm—Knobbe, Martens, Olson & Bear, LLP

(57) ABSTRACT

A method of manufacturing a wiring board comprising the steps of winding an electrical wire around a insulating plate having a number of electrical wire grooves for placing an electrical wire therein and a number of terminal grooves formed at positions corresponding to the electrical wire grooves in which the attached pressure connection terminal is connected to the electrical wire making use of the electrical wire grooves; cutting the electrical wire wound around the insulating plate at desired positions; and attaching the pressure connection terminal at a desired position in the number of terminal grooves, a wiring board, and an electrical connection box manufactured by accommodating the wiring box in a casing.

12 Claims, 9 Drawing Sheets

WIRING BOARD MANUFACTURE METHOD, WIRING BOARD, AND ELECTRICAL CONNECTION BOX

BACKGROUND OF THE INVENTION

1. Field of the Invention

The present invention relates to a wiring board manufacture method, a wiring board, and an electrical connection box.

2. Description of the Related Art

As a wiring board used in an electrical connection, a wiring body manufactured by winding electrical wire around a divided cylindrical bodies with a plurality of terminal blocks provided thereon, wiring the electrical wire into a desired form making use of a plurality of accommodating sections for the plurality of terminal blocks, fixing the electrical wire to the accommodating sections with pressure connection terminals attached to the terminal blocks and also connected to the electrical wire, and reforming the electrical wire into the desired form has been proposed (Refer to Japanese Patent Application No. HEI 11-165544).

In the manufacture method disclosed in the application above, however, when reforming the wired electrical wire by bending it, the plurality of terminal blocks are hung down from the electrical wire, which is unstable, and therefore it is difficult to reform the electrical wire into a desired form, and in addition, a facility having a substantially complicated structure is required for manufacturing a wiring body, namely a wiring board, and in addition the production cost of the wiring board is disadvantageously expensive. Further, in the manufacture method described above, the electrical wire is bent many times for reforming, so that sometimes the attached pressure connection terminal may be removed from the terminal block, which requires a laborious work and makes the product quality unstable.

SUMMARY OF THE INVENTION

It is an object of the present invention to provide a method of manufacturing a wiring board which can be manufactured with a production facility having a simple structure, enables reduction of the production cost, and can be produced without not requiring laborious works and with stable product quality as well as to provide the wiring board and an electrical connection box in which the wiring board is used.

To achieve the object described above, the wiring board manufacture method according to the present invention comprising a step of winding, around an insulating plate with a number of electrical wire grooves each for placing an electrical wire therein and a number of terminal groove formed at positions corresponding to the electrical wire grooves in which the attached pressure connection terminal is connected to the electrical wire, making use of the electrical wire groove; a step of cutting the electrical wire wound around the insulating plate at a desired position; and step of attaching the pressure connection terminal at a desired position in the number of terminal grooves.

Preferably, a step of cutting the electrical wire at a desired position in the step of winding the electrical wire around the insulating plate making use of the electrical wire grooves.

Also preferably, the pressure connection terminal has a plurality of push-in sections or a plurality of tab terminals.

Preferably, the electrical wire is wound by rotating the insulating plate.

Further to achieve the object described above, the wiring board according to the present invention comprises an insulating plate having a number of electrical wire grooves provided at a specified space therebetween and also a number of terminal grooves formed at positions corresponding to the electrical wire grooves; an electrical wire wound around the insulating plate making use of desired ones among the number of electrical wire grooves and cut at a desired position; and pressure connection terminal attached to the terminal groove.

Preferably the pressure connection terminal has a plurality of push-in sections or a plurality of tab terminals.

Also preferably, the insulating plate is made from a synthetic resin including polypropylene and polybutylene telephthalate.

Further to achieve the object described above, in the electrical connection box according to the present invention, the wiring board manufactured according to the manufacture method described above is manufactured in the state where the wiring board is accommodated in a casing with a connector housing.

Preferably the casing described above has an upper case and a lower case.

Other objects, features, and advantages of the present invention will be clarified by referring to the description below based on the attached drawings.

DETAILED DESCRIPTION OF THE PREFERED EMBODIMENT

The wiring board manufacture method, wiring board, and an electrical connection box according to one embodiment of the present invention are described in detail below with reference to FIG. 1 to FIG. 10.

Figure 1:
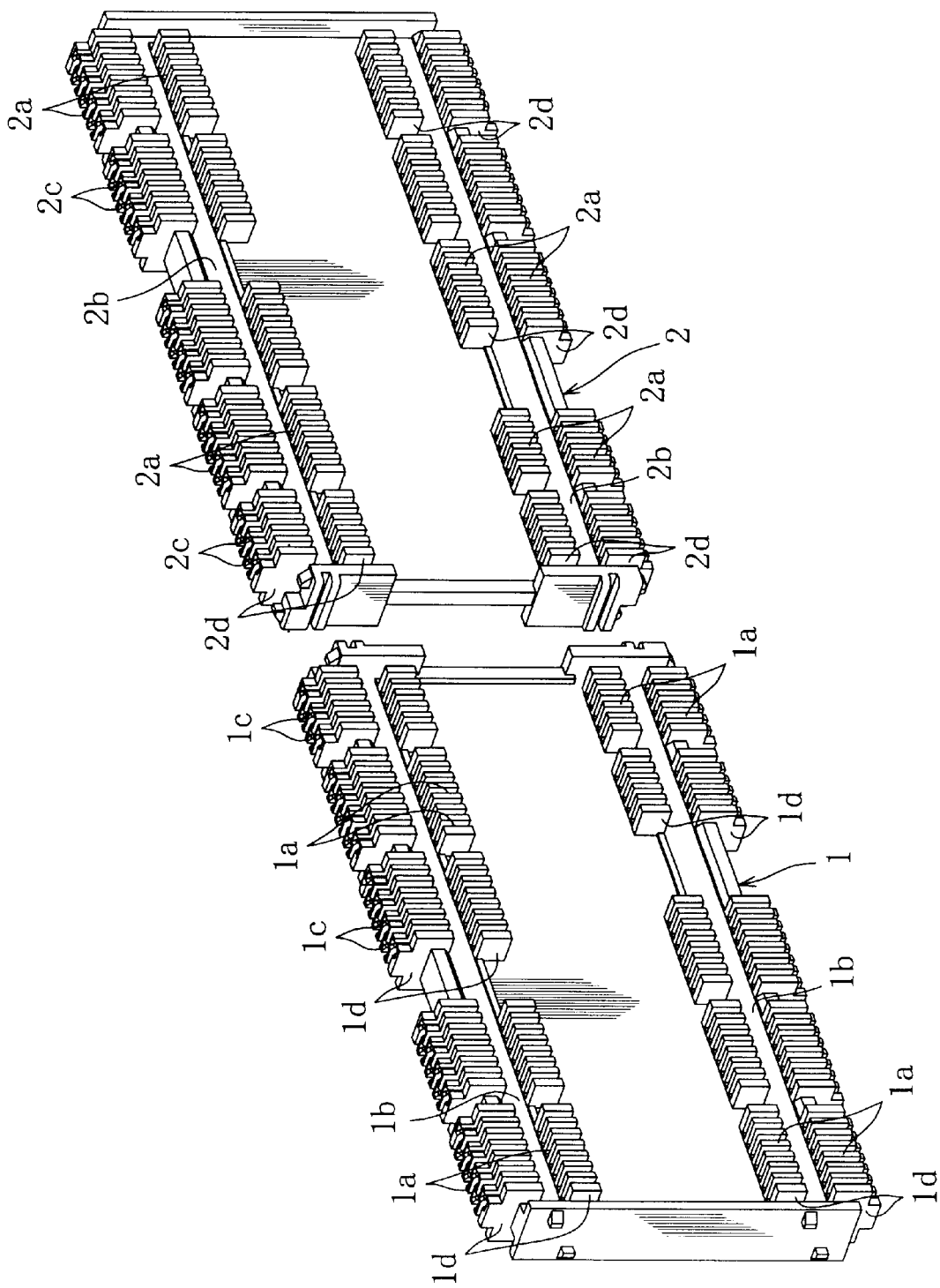
FIG. 1 is a perspective view showing an insulating plate used in the wiring board manufacture method according to the present invention.

In the wiring board manufacture method according to the present invention, as shown in FIG. 1, two sheets of insulating plates 1, 2 each formed from a synthetic resin such as polypropylene (PP) or polybutylene terephthalate (PBT) into a substantially rectangular form and having the electrical insulating capability are used. Each of the insulating plates 1, 2 has a number of electrical wire grooves 1a, 2a in which an electric wire is placed, cut spaces 1b, 2b for cutting the electrical wire at desired positions, and a number of terminal grooves 1c, 2c formed at positions corresponding to the electrical grooves 1a, 2a in which the attached pressure connection terminal is connected to the electrical wire.

Figure 2:
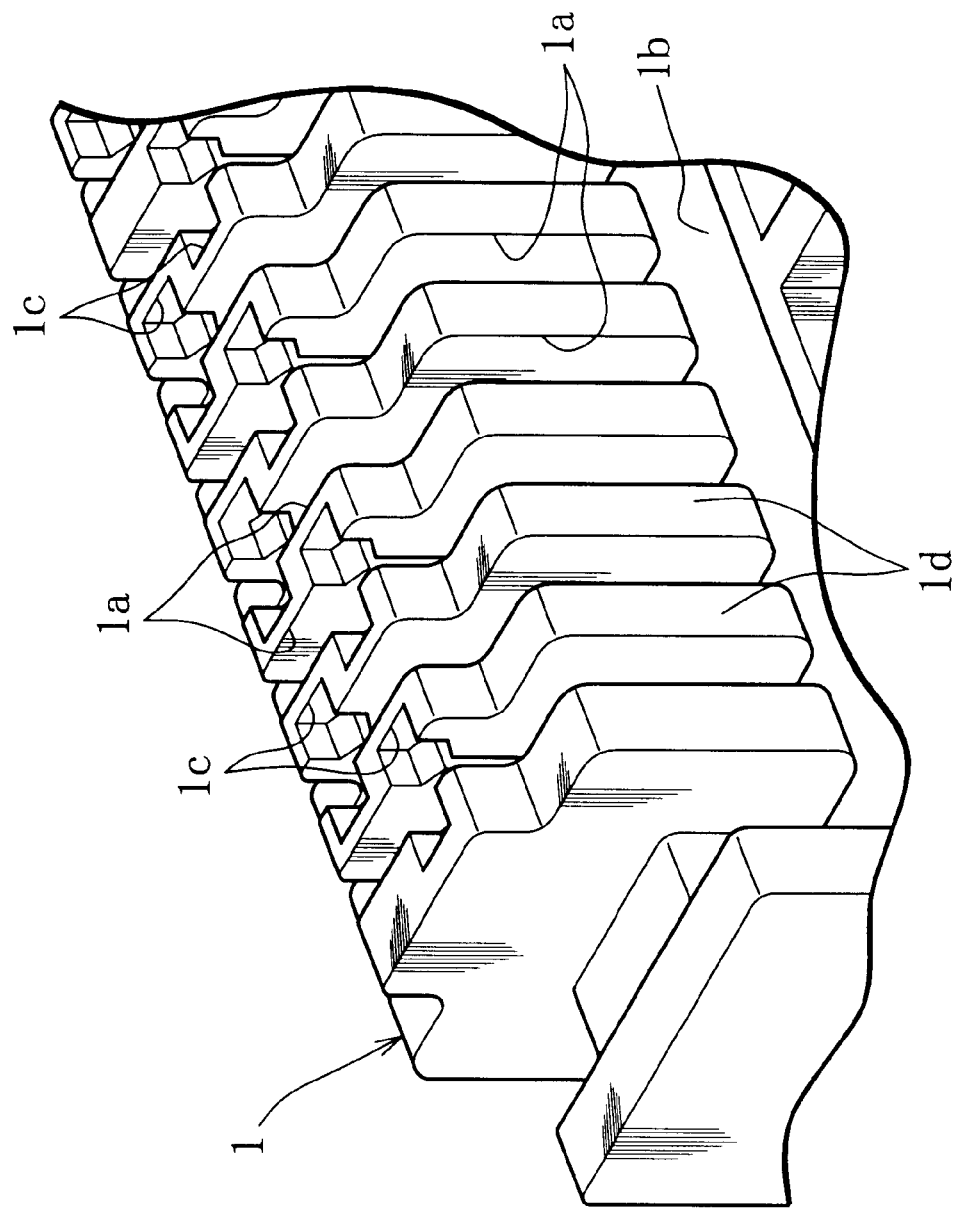
FIG. 2 is a partially enlarged view of the insulating plate shown in FIG. 1 and mainly shows terminal grooves on the insulating plate.

As shown in the figure, each of the insulating plates 1, 2 has a number of electrical wire grooves 1a, 2a for setting the electrical wire with a number of partition plates 1d, 2d formed in series at two side edges thereof, and also has cut spaces 1b, 2b provided between the two rows of partition plates formed at the two side edges thereof. The terminals grooves 1c, 2c are formed in a direction rectangular to each of the terminal grooves 1c, 2c on edge faces at the two side edges of the insulating plate 1 as shown in FIG. 2.

Figure 3:
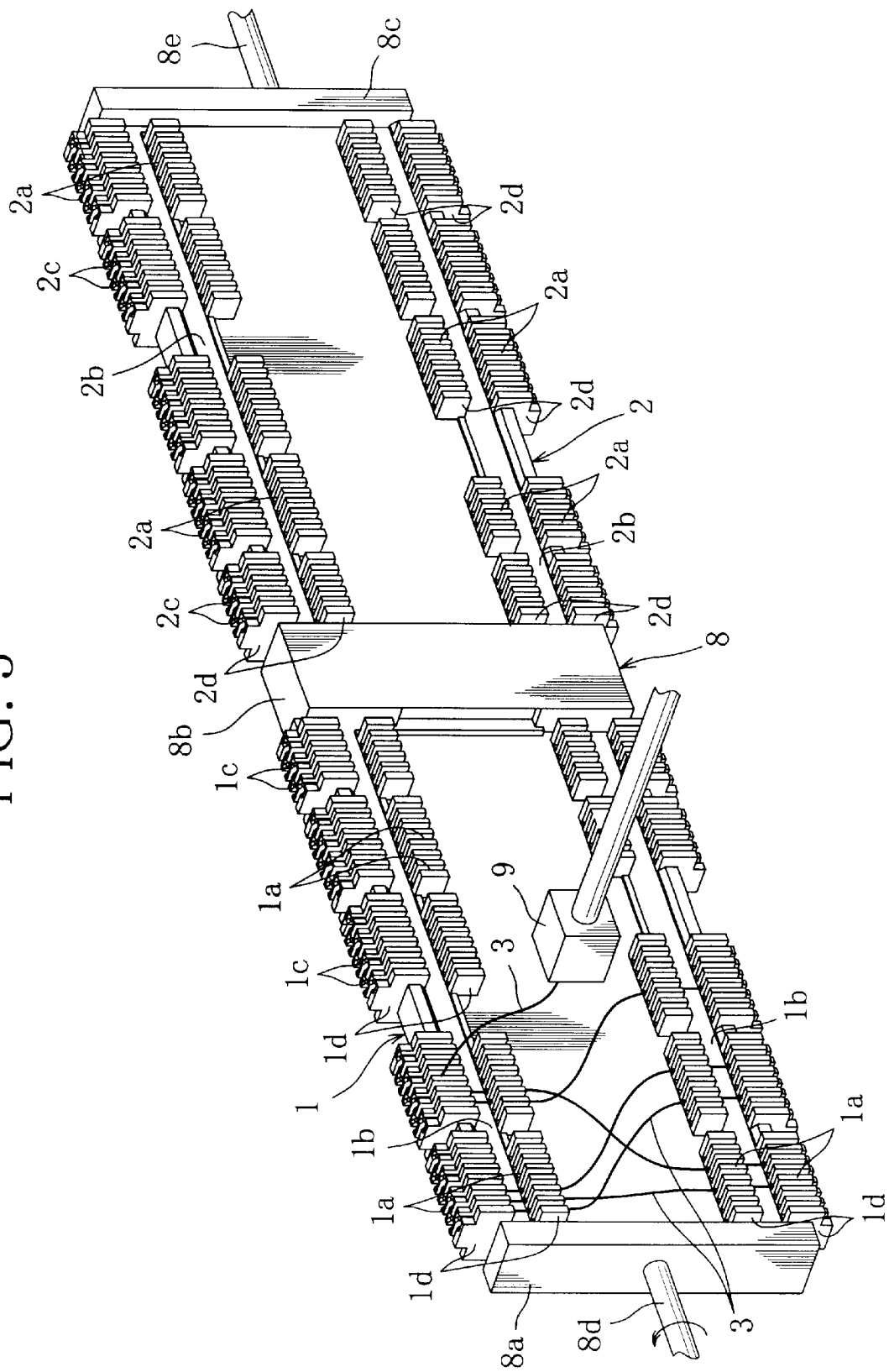
FIG. 3 is a perspective view illustrating the wiring board manufacture method according to the present invention and showing the state in which the insulating plate shown in FIG. 1 is set in a rotating tool.
Figure 4:
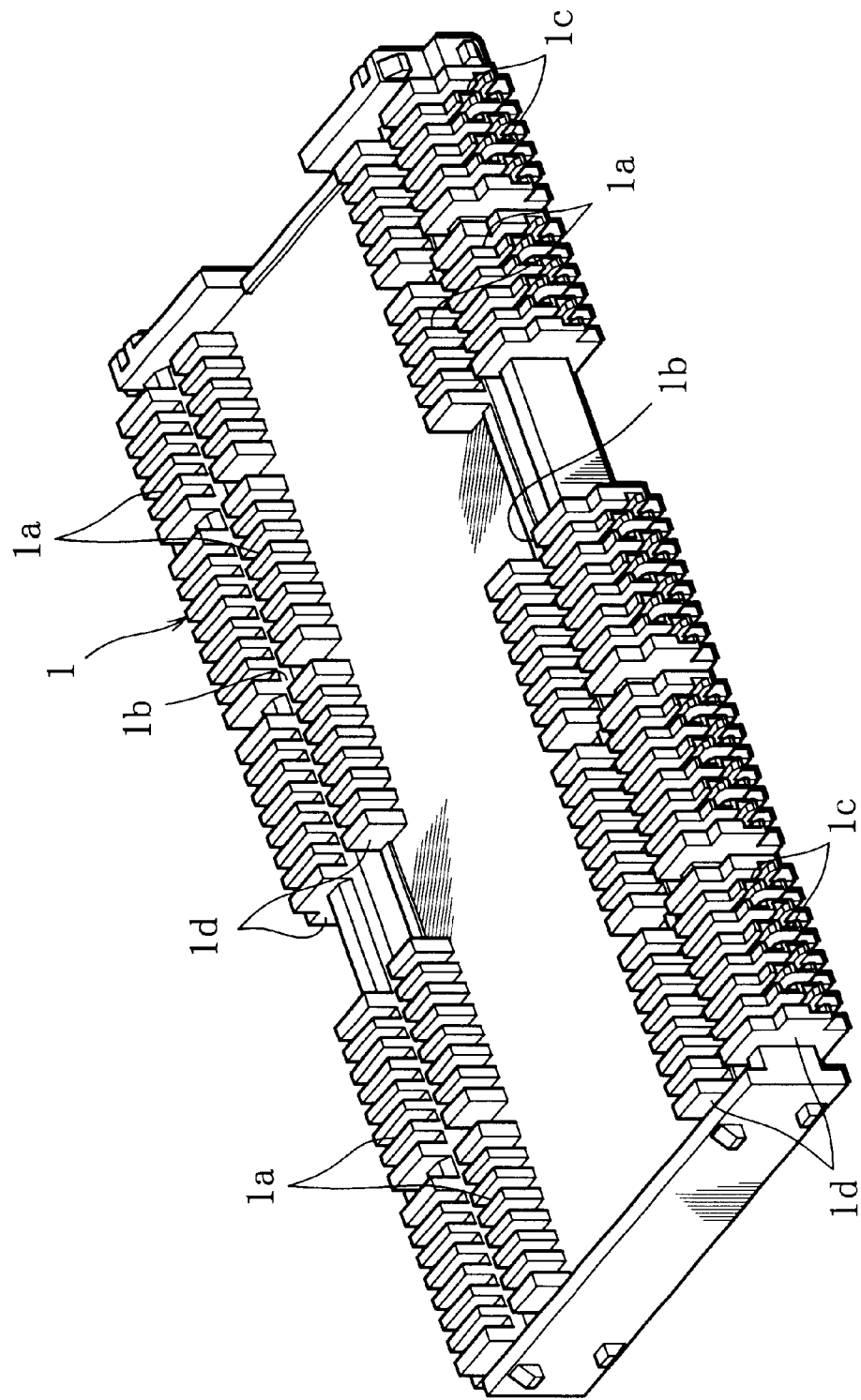
FIG. 4 is a perspective view showing a wiring board before a connection terminal is attached thereto.

When the wiring board is manufactured, a rotating tool 8 having holders 8a to 8c for holding the insulating plates 1, 2 and a wiring head 9 is used as shown in FIG. 3. In this step, operations of the holders 8a, 8c as well as of the wiring head 9 of the rotating tool 8 are controlled by a control unit not shown in the figure such as an electronic control unit (ECU) so that the electrical wire is wired into a desired form previously designed. The wiring head 9 can freely move at least in the direction rectangular to surfaces of the insulating plates and also in the longitudinal direction thereof, and draws out an electric wire 2 from a drum not shown herein and feeds it to the insulating plates 1, 2 in association with rotation of the insulating plates 1, 2 by the holders 8a to 8c.

Namely, when the wiring board is manufactured, at first the insulating plates 1, 2 are held with the holders 8a to 8c of the rotating tool 8, and the wiring head 9 is moved to press the electrical wire 9 into the desired electrical wire groove 1a of the insulating plate 1 as a wiring start position.

Then operation of the rotating tool 8 is started, and the holders 8a to 8c, and as a result the insulating plates 1, 2 are rotated by the rotation shafts 8d, 8e at a specified rotating speed in the direction indicated by the arrow head in FIG. 3.

While the insulating plates 1, 2 are rotating, the electrical wire 2 is wound around the insulating plates 1, 2 making using of the number of electrical wire grooves 1a, 2a in the way like drawing with one stroke by moving the wiring head 9 along surfaces of the insulating plates 1, 2 in the longitudinal direction thereof (from left to right direction in FIG. 1). With this operation, the electrical wire 3 is positioned in the specified electrical groove 1a among the number of electrical wire grooves 1a formed on the insulating plate 1 and is wired up to the electrical wire groove 2a on the insulating plate 2 as shown in FIG. 3, thus the desired wiring pattern previously designed being realized.

As described above, the electrical wire 3 is wired in desired form on both top and rear surfaces of the insulating plates 1, 2 making use of the number of electrical wire grooves 1a, 2a formed on the top and rear surfaces thereof, and then the insulating plates 1, 2 are removed from the holders 8a to 8c.

Then the electrical wire 3 wound around the insulating plates 1, 2 are cut at desired positions making use of the cut spaces 1b, 2b. In this step, the electrical wire 3 is cut at specific positions depending on a wiring pattern decided according to an application of the manufactured wiring board.

Figure 5:
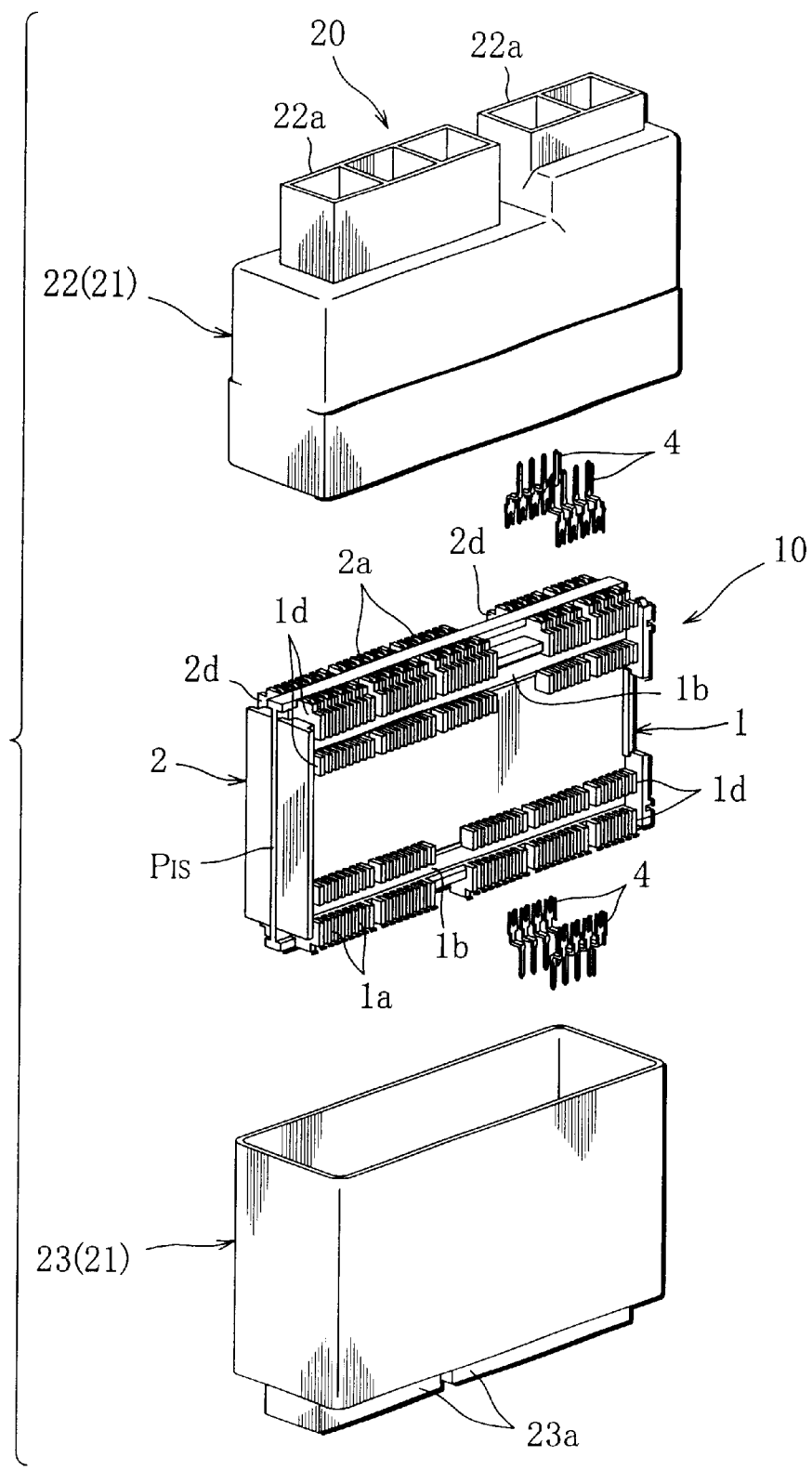
FIG. 5 is a perspective view showing the state in which a manufactured wiring board is accommodated in a casing to assemble an electrical connection box.

Then other insulating plate PIS is placed between the insulating plates 1, 2, which are folded up at adjoining sections linked to each other with the electrical wire 3 and piled up on each other (Refer to FIG. 5). The insulating plate 2 and electrical wire 3 under the insulating plate 1 are not shown in FIG. 4 for simplicity. The electrical wire is not shown also in FIG. 5 for the same reason.

Then the pressure connection terminals 4 are attached to the desired terminal grooves 1c, 2c on the insulating plates 1, 2, thus the wiring board 10 being completed (Refer to FIG. 5).

Herein the pressure connection terminal 4 is a terminal with a tab terminal 4a provided at one edge thereof and push-in section 4b to be pressed into the terminal grooves 1c, 2c provided at another edge thereof, and a U-shaped slot 4c is formed at a center of the push-in section 4b. When the push-in section 4b of the pressure connection terminal 4 is pressed into the terminal grooves 1c, 2c, the electrical wire 3 in the terminal grooves 1c, 2c is pushed in the slot 4 with the covering cut off, and with this operation, a lead wire (not shown) is electrically connected to the push-in section 4b. Further the pressure connection terminals 4 are attached to specified terminal grooves 1c, 2c decided according to the circuit configuration of the manufactured wiring board.

As described above, the method according to the present invention comprises a step of winding the electrical wire 3 around the insulating plates 1, 2 making use of the electrical wire grooves 1a, 2a; a step of cutting the electrical wire 3 wound around the insulating plates 1, 2 at desired positions making use of the cut spaces 1b, 2b; and a step of attaching the pressure connection terminal at a desired position in the number of terminal grooves 1c, 2c. Because of the configuration, with the present invention, the structure of the facility used for manufacturing the wiring board 10 is simplified, which enables reduction of the production cost. Further the manufacture method does not require laborious and complicated works and insure manufacture of the wiring board 10 with stable quality.

An electrical connection box 20 can be assembled quite simply by accommodating the wiring board 10 manufactured as described above in a casing 21 having an upper case 22 and a lower case 23 as shown in FIG. 5.

The upper case 22 and lower case 23 each have a flat rectangular box-lie form with tab terminals 4a of the pressure connection terminal 4 accommodated in an upper section of the upper case 22 and in a lower section of the lower case 23 respectively, and a plurality of connector housings 22a, 23a each with a connector provided for connection to the tab terminal 4a are provided.

In the wiring board manufacture method according to the present invention, a wiring board is manufactured by rotating the insulating plates 1, 2, moving the wiring head 9 along surfaces of the insulating plates 1, 2 in the longitudinal direction thereof, and wiring the electrical wire 3 into a desired pattern on the insulating plates 1, 2 in a way similar to the drawing with one stroke making use of the number of electrical wire grooves 1a, 2a. In this step, the electrical wire 3 is cut at specified positions according to a wiring pattern decided according to an application of the manufactured wiring board, but when a number of wiring paths are to be formed with the electrical wire 3, it is necessary to reciprocally move the electrical wire 2 along the surfaces of the insulating plates 1, 2 in a way like drawing with one stroke.

Figure 7A:
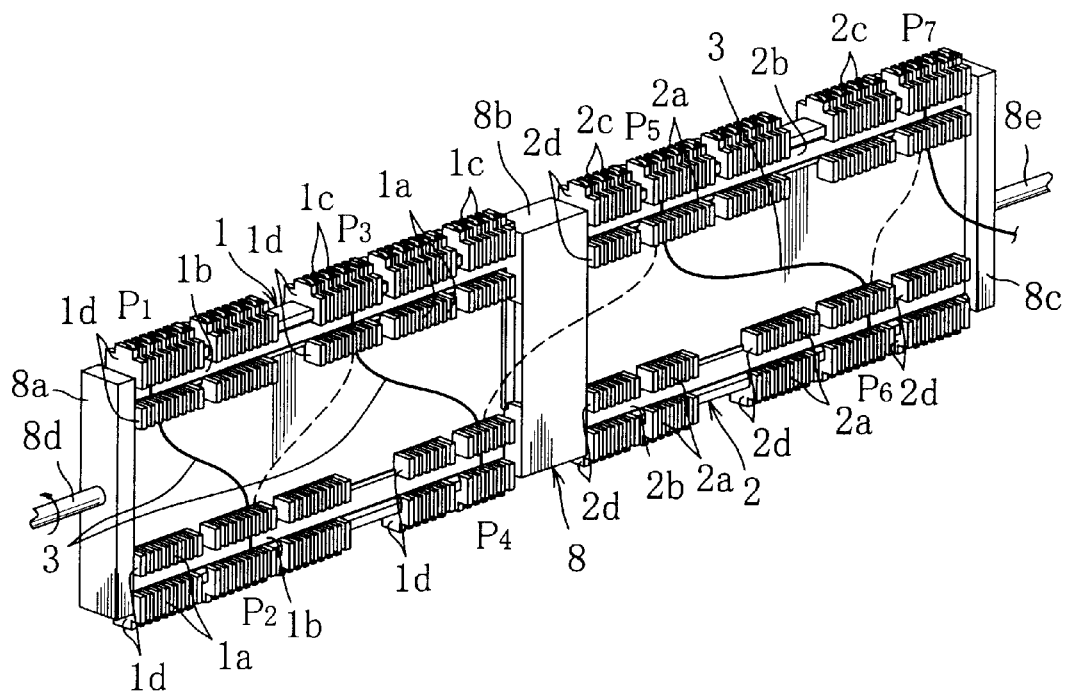
FIG. 7A and FIG. 7B are perspective views each for illustrating the troubles in wiring on an insulating plate.
Figure 7B:
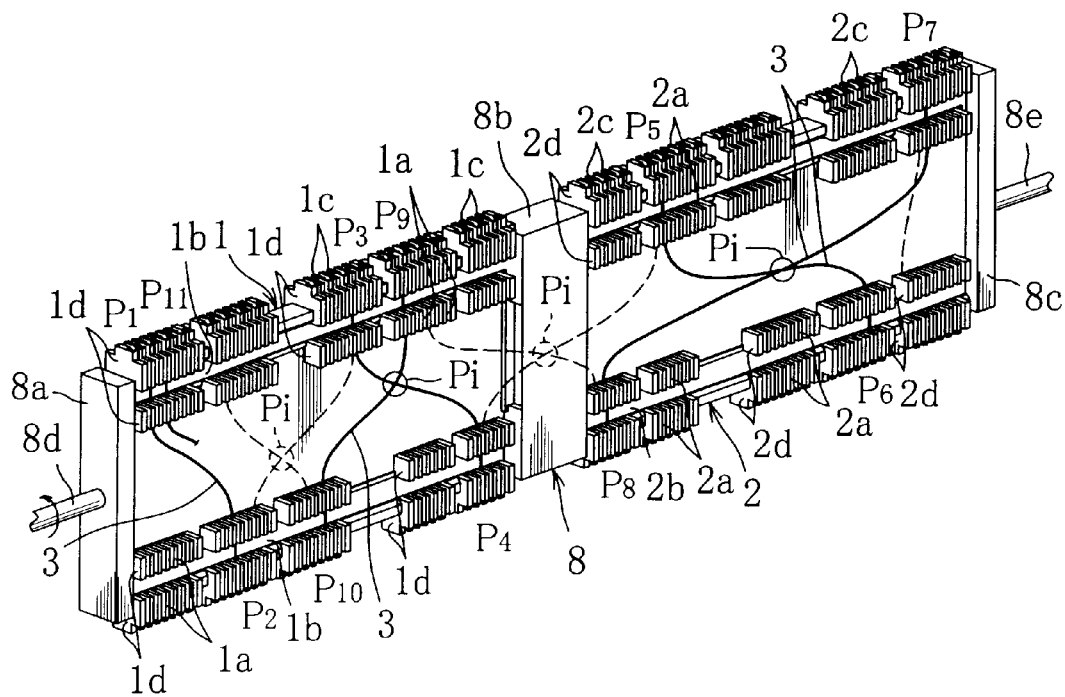

Because of this necessity, for instance, the insulating plates 1,2, on which the electrical wire 3 is wired in the sequence from P1 to P7 in the rightward direction rotating the insulating plates 1, 2 in the direction indicated by the arrow mark as shown in FIG. 7A and then wired in the sequence from P8 to P11 in the leftward direction as shown in FIG. 7B, have the features as described below.

Namely in the case of the insulating plates 1, 2 shown in FIG. 7B, each time the wiring head 9 is reciprocally moved, the electrical wire 3 is piled up at the points Pi in the same side against the surfaces of the insulating plates 1, 2, and when the number of points is large, the thickness increases in the direction rectangular to the surface of the manufacture wiring board. At the same time, times of reciprocal movement of the wiring head 9 in the horizontal direction increase, and when a number of electrical wires 3 accommodated in the same electrical wire grooves 1a, 2a increases, the electrical wire 3 is pushed off from the electrical wire grooves 1a, 2a of the manufactured wiring board. If this situation occurs, the manufactured wiring board can not be accommodated in the casing 21.

To overcome this problem, in the wiring board manufacture method according to the present invention, when wiring is carried out by reciprocally moving the wiring head many times as described above, in the step of winding the electrical wire 3 making use of the electrical wire grooves 1a, 2a, further a step of cutting the electrical wire 3 at desired position is provided, and wiring is carried out as described below.

Figure 8A:
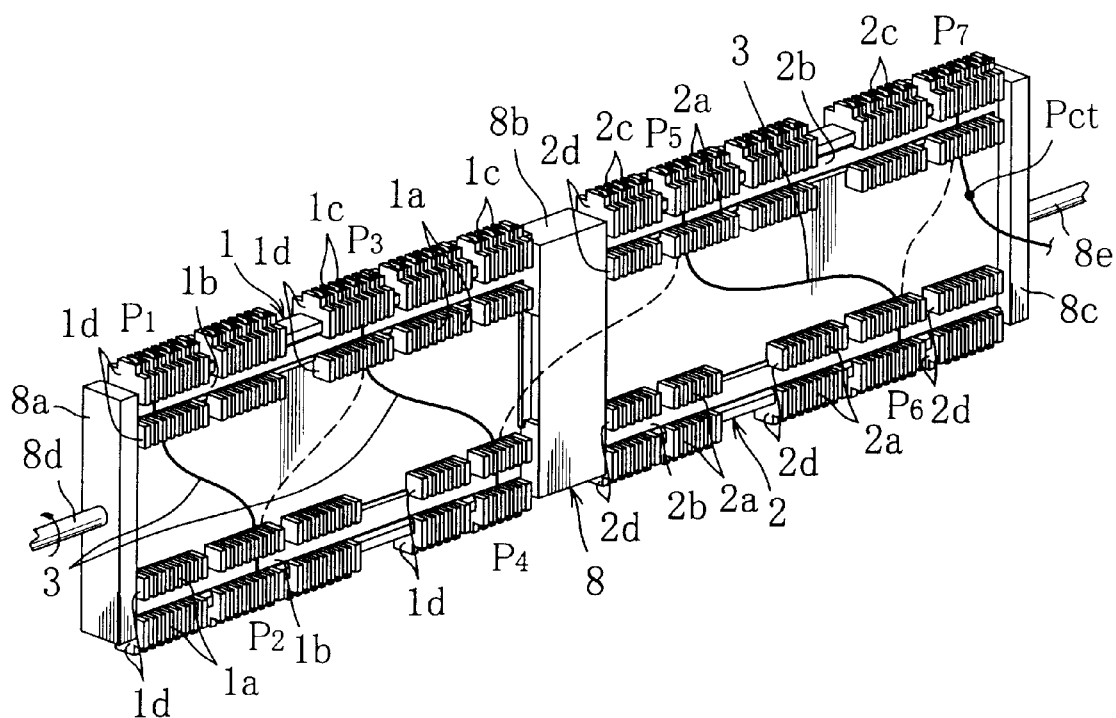
FIG. 8A and FIG. 8B are views each showing a variant of the method according to the present invention for dissolving the troubles shown in FIG. 7A and FIG. 7B.

Namely, as shown in FIG. 8A, the electrical wire 3 is wired in the rightward direction following the sequence from P1 to P7 rotating the insulating plates 1, 2 in the direction indicated by the allow head as shown in FIG. 8A, and then the electrical wire 3 is cut at the points Pct. Then the wiring head 9 is returned to the original position, and the electrical wire 3 is wired again in the rightward direction following the sequence from P8 to P11 as shown in FIG. 8B.

Figure 8B:
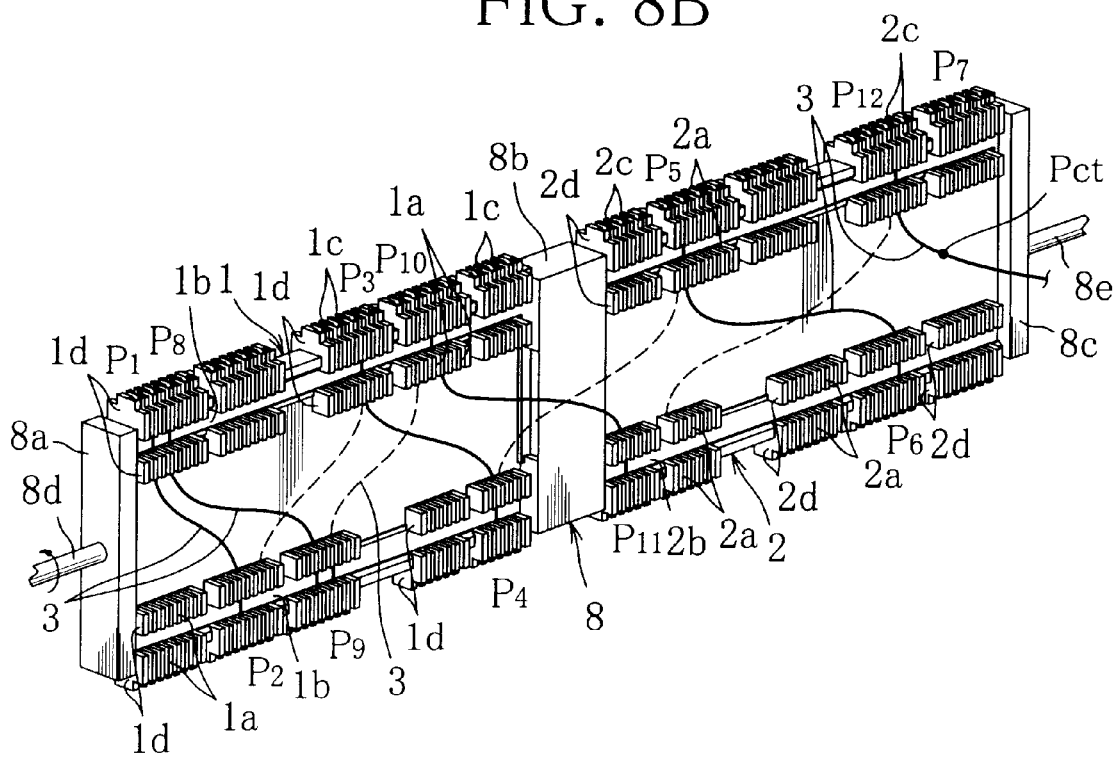

In this case, as clearly understood from FIG. 8B, the circuit has the same pattern as the wiring pattern shown in FIG. 7, but the electrical wire 3 is not piled up in the same side against the surfaces of the insulating plates 1, 2. Therefore, even if the wiring head 9 is reciprocally moved many times, the electrical wire 3 is always wired in the same direction, so that the thickness of the insulating plates 1, 2 does not increase in the direction rectangular to the surfaces of the insulating plates 1, 2. Also when wiring is carried out as described above, times of placing the electrical wire 3 in the same electrical wire grooves 1a, 2a decrease, so that the electrical wire 3 is not pushed out from the electrical wire grooves 1a, 2a.

For the reasons described above, in the insulating plates 1, 2 on which the electrical wire 3 is wired, the electrical wire 3 is not off from the insulating plates 1, 2. Therefore, in the wiring board 10 manufactured, as shown in FIG. 5, by placing the insulating plate PIS placed between the insulating plates 1, 2 and the folding up the insulating plates 1, 2 at the adjoining sections linked with the electrical wire 3 to each other to pile up on each other, interference by an inner wall of the casing 21 never occurs, and the wiring board 10 can easily and smoothly be set in the casing to assemble the electrical connection box.

When a plurality of wiring heads 9 are used, wiring as shown in FIG. 8A and that shown in FIG. 8B can advantageously be carried out with only a slight time lug.

Figure 6:
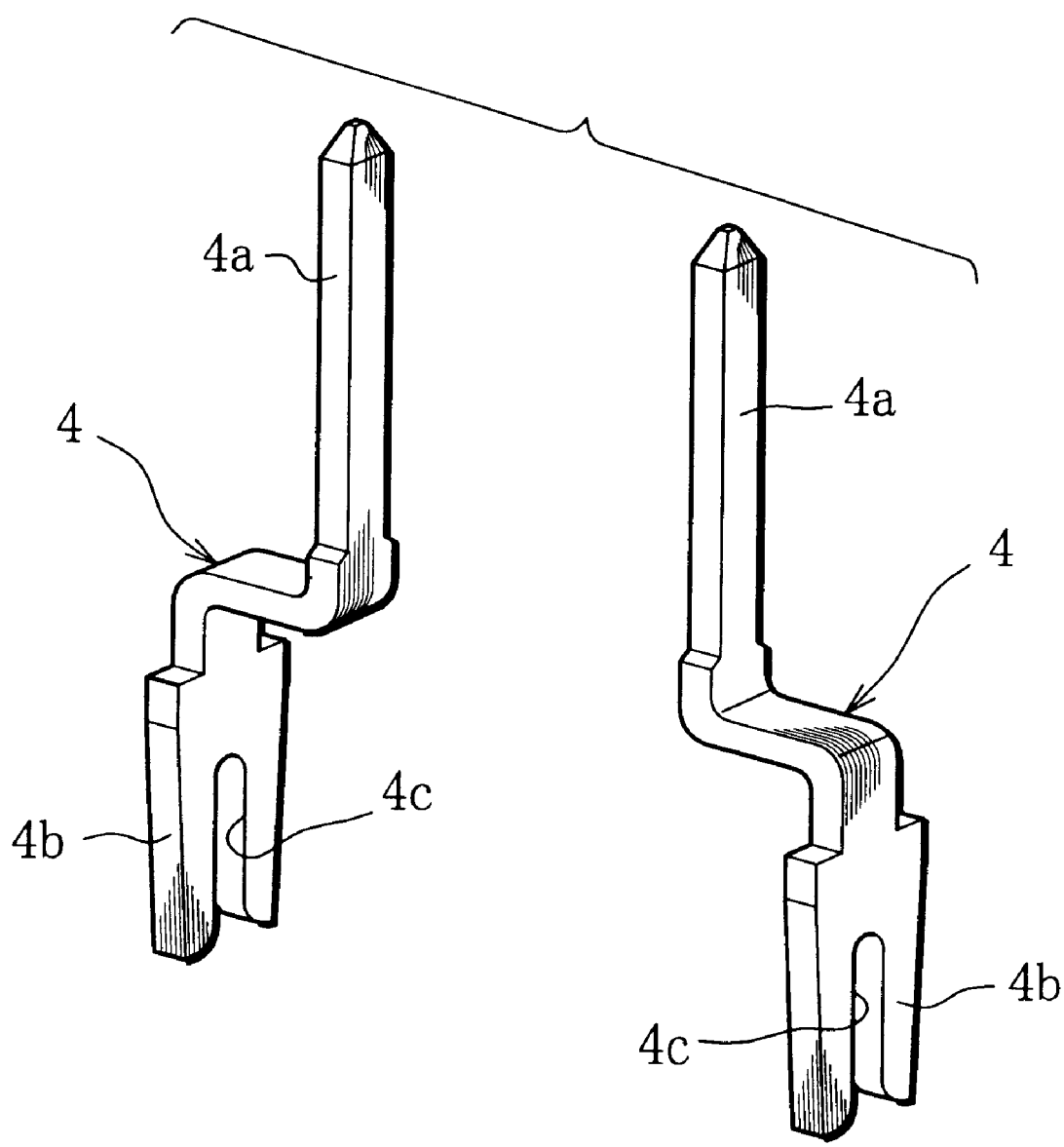
FIG. 6 is a perspective view showing a pressure connection terminal attached to the wiring board.
Figure 9:
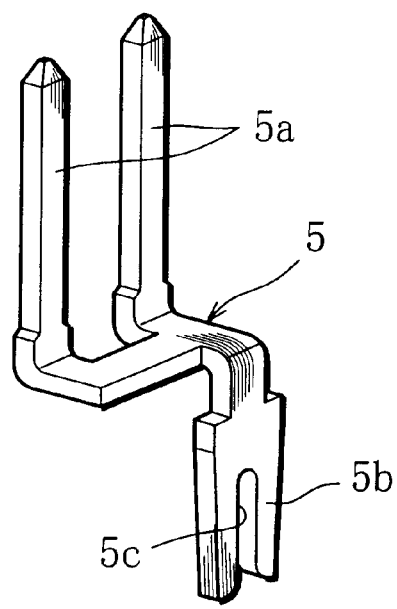
FIG. 9 is a perspective view showing another example of the pressure connection terminal attached to the wiring board.
Figure 10:
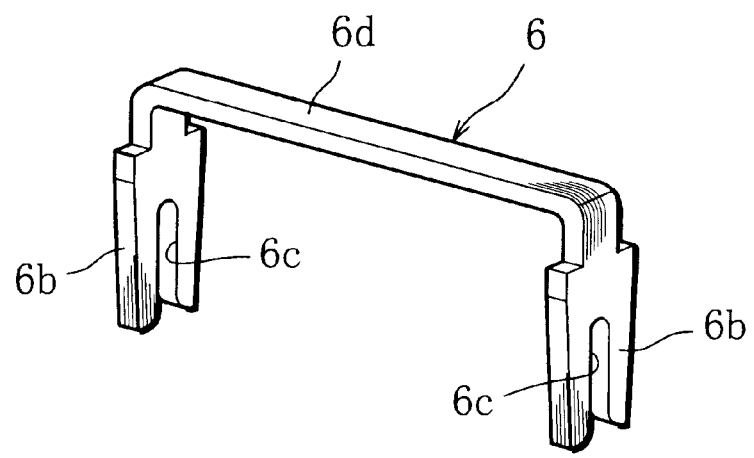
FIG. 10 is a perspective view showing still another example of the pressure connection terminal attached to the wiring board.

It is to be noted that the pressure connection terminals to be attached to the terminal grooves 1c, 2c are not limited to the pressure connection terminal 4 shown in FIG. 6. For instance, the configuration in which two tab terminals 5a at one edge thereof and a push-in section 5b having a U-shaped slot 5c at the other edge thereof like the joint terminal 5 shown in FIG. 9 is allowable. Further the configuration is allowable in which, like the joint terminal 6 shown in FIG. 10, two push-in sections 6b each having the U-shaped slot 6c are linked with a bridge section 6d to link the electrical wire 3 on the insulating plate 1 to that on the insulating plate 2.

With the pressure connection terminals 5, 6 as described above, it is possible to connected the electrical wires 3 wired as described above in various forms and also to form various circuit patterns with the electrical wire 3, thus a freedom in designing the wiring board 10 being substantially improved.

It is to be noted that, although the wiring board 10 in the embodiment described above was manufactured with the insulating plates 1, 2 each having a substantially rectangular form, but the form of the insulating plates 1, 2 and resulting forms of the wiring board 10 and the electrical connection box 20 are not always limited to the rectangular ones, and various forms may be employed according to an application of the electrical connection box or according to a designing concept.

Although the two sheets of insulating plates 1, 2 are set on the rotating tool 8 in this embodiment, three or more insulating plates may be used on the condition that the rotating tool 8 can hold the plates.

What is claimed is:

1. A method of manufacturing a wiring board comprising the steps of:

winding an electrical wire around an insulating plate having a number of electrical wire grooves for placing an electrical wire therein and a number of terminal grooves formed at positions corresponding to the electrical wire grooves in which an attached pressure connection terminal is connected to the electrical wire making use of the electrical wire grooves;

cutting the electrical wire wound around the insulating plate at a desired position; and attaching the pressure connection terminal at a desired position in the number of terminal grooves.

2. The wiring board manufacture method according to claim 1 further comprising the step of:

cutting the electrical wire at a desired position during the step of winding the electrical wire around the insulating plate making use of the electrical wire grooves.

3. The wiring board manufacture method according to claim 2, wherein said electrical wire is wound by rotating the insulating plate.

4. The wiring board manufacture method according to claim 1, wherein said pressure connection terminal has a plurality of push-in sections.

5. The wiring board manufacture method according to claim 1, wherein said pressure connection terminal has a plurality of tab terminals.

6. The wiring board manufacture method according to claim 1, wherein said electrical wire is wound by rotating the insulating plate.

7. An electrical connection box manufactured in the state where the wiring board manufactured by the manufacture method according to claim 1 is accommodated in a casing with a connector housing.

8. The electrical connection box according to claim 7, wherein said casing has an upper case and a lower case.

9. A wiring board with an electrical wire wired in a desired pattern, said wiring board comprising:

an insulating plate with a number of electrical wire grooves provided at a specified space and also having a number of terminal grooves provided at positions corresponding to the electrical wire grooves;

an electrical wire wound around the insulating plate making use of desired ones among the number of electrical wire grooves and cut at a desired position; and a pressure connection terminal attached to the terminal groove.

10. The wiring board according to claim 9, wherein said pressure connection terminal has a plurality of push-in sections.

11. The wiring board according to claim 9, wherein said pressure connection terminal has a plurality of tab terminals.

12. The wiring board according to claim 9, wherein said insulating plate is made from synthetic resin including polypropylene, and polybutylene terephthalate.

* * * * *